United States Patent [19]

Scharrer et al.

[11] Patent Number: 4,858,183
[45] Date of Patent: Aug. 15, 1989

[54] ECL HIGH SPEED SEMICONDUCTOR MEMORY AND METHOD OF ACCESSING STORED INFORMATION THEREIN

[75] Inventors: Carl J. Scharrer; Roland H. Pang, both of Plano, Tex.

[73] Assignee: Texas Instruments Incorporated, Dallas, Tex.

[21] Appl. No.: 57,399

[22] Filed: Jun. 2, 1987

[51] Int. Cl.⁴ .................. G11C 11/34; G11C 11/00
[52] U.S. Cl. .................... 365/174; 365/177; 365/179; 365/154; 365/156
[58] Field of Search ............... 365/174, 154, 156, 189, 365/177, 190, 202, 181, 155, 179

[56] References Cited

U.S. PATENT DOCUMENTS

| | | | |
|---|---|---|---|
| 4,004,284 | 1/1977 | Heeren .................................. | 340/173 |
| 4,314,359 | 2/1982 | Kato et al. .......................... | 365/155 |
| 4,594,688 | 6/1986 | Uno ..................................... | 365/95 |
| 4,692,900 | 9/1987 | Ooami et al. ........................ | 365/179 |
| 4,701,883 | 10/1987 | Wrathall et al. ................... | 365/154 |
| 4,730,275 | 3/1988 | Baskett ............................. | 365/174 X |
| 4,742,488 | 5/1988 | Wong ................................ | 365/189 X |
| 4,779,230 | 10/1988 | McLaughlin et al. .............. | 365/156 |

OTHER PUBLICATIONS

A 4 nsec 4Kx1bit Two-Port BiCMOS SRAM, by T. S. Yang, M. A. Horozitz and B. A. Wooley, Proc. 1988 Custom Integrated Circuits Conference, May 1988.

*Primary Examiner*—Stuart N. Hecker
*Assistant Examiner*—Alfonso Garcia
*Attorney, Agent, or Firm*—Thomas R. FitzGerald; Leo N. Heiting; Melvin Sharp

[57] ABSTRACT

A hybrid ECL memory includes a hybrid memory array 36 which utilizes cross coupled CMOS latches (70). Each CMOS latch (70) is accessed by an ECL decoder (40) and an ECL Word Line driver (42) to read data therefrom. Data is accessed through a bipolar transistor (120) for output to an ECL sense amp. The column select operation is provided by an ECL decoder (50) to select both the Read and the Write operation. The Write operation is provided with emitter coupled logic by pulling up one of the storage nodes in the CMOS latch (70) with a low source impedance PNP transistor (122). Selection is provided by varying the Word Line between two voltages through a low source impedance transistor (78) with the voltages being ECL compatible.

11 Claims, 3 Drawing Sheets

ECL HIGH SPEED SEMICONDUCTOR MEMORY AND METHOD OF ACCESSING STORED INFORMATION THEREIN

TECHNICAL FIELD OF THE INVENTION

The present invention pertains in general static random access memories and, more particularly, to a high speed bipolar memory utilizing a low current CMOS latch for the memory cell.

CROSS REFERENCE TO RELATED APPLICATIONS

This application is related to U.S. patent application Ser. No. 07/045,982 filed May 1, 1987.

BACKGROUND OF THE INVENTION

High speed memories have conventionally utilized bipolar technology due to the low source impedance of bipolar transistors as opposed to use of MOS transistors which provide a nonlinear resistance for driving various nodes and output lines. Pure MOS memories are relatively slow with respect to access time as compared to bipolar memories. This is due to the fact that high density memories have a large number of transistors which are interconnected by long lengths of line which have a relatively high capacitance associated therewith. However, MOS memories have a significant advantage over bipolar memories in that they draw very low current.

In order to improve the access time of an MOS memory, bipolar devices have been combined with MOS devices to provide a low source impedance to drive various output or high capacitance nodes. However, when combining bipolar and CMOS transistors on the same integrated circuit, it is necessary that the voltages that control the various transistors be compatible. For example, bipolar transistors utilizing emitter coupled logic (ECL) require a very small voltage swing whereas MOS devices require rather large voltage swings to insure proper operating characteristics.

Generally, specifications for high speed memories require compatibility with ECL levels. Therefore, when MOS technology is incorporated into a high speed bipolar device, translation circuits are utilized to interface between the ECL circuitry and the MOS circuitry. For example, in an ECL memory, the input and output of all the address lines to the package would require ECL compatibility. When an MOS memory cell which would provide low current is utilized, translation circuits internal to the package are required to convert the ECL voltage swings to the much higher voltage swing required for MOS circuitry. This can be a disadvantage due to the larger amount of circuitry required to perform the translation, which circuitry would inherently have a predetermined amount of delay and also consume additional current.

Since the purpose of incorporating MOS transistors into a high speed memory is to minimize power consumption, the use of translation circuits would detract somewhat from the realized advantages. A further disadvantage exists in the size of the MOS memory cells which are usually rather large due to the requirement that the MOS transistors must drive large capacitive loads. In order to provide the appropriate drive at a reasonable operating speed, the size of the MOS transistors is increased to lower the series resistance or source impedance of that transistor. This results in an overly large cell which, in addition to the additional circuitry required for the translation, requires a proportionally large amount of silicon area to realize a practical memory cell with MOS transistors.

SUMMARY OF THE INVENTION

The present invention disclosed and claimed herein comprises a hybrid semiconductor memory. The memory includes an array of memory cells arranged in rows and columns with each of the memory cells comprising a CMOS latch. Each row has a row line associated therewith and each column has a read column line and a write column line associated therewith. Column and row addresses are received and decoded to provide row and column select signals. A row is selected by generating a row select voltage for application to the row line with nonselected row lines having a lower voltage applied thereto. Read circuitry is associated with each cell for sensing the stored voltage in response to the associated row line being at the row select voltage. When selected, the read circuitry drives the associated read column line with a low source impedance to output a signal representative of the stored logic state. Sense circuitry is associated with each of the read column lines for sensing the representative logic state in response to generation of a column select signal for the associated cell. The Write operation is controlled by data circuitry which receives external data and interfaces the received data with the write column line for the selected column when both a column select signal and an external Write Enable signal are present. Driving circuitry is associated with each cell for forcing the logic state in one of the cells associated with the selected row and column to a voltage corresponding to the logic state of the received data on the selected write column line.

In another embodiment of the present invention, the CMOS latch comprises a cross coupled latch having two storage nodes for being disposed at opposite voltages. The higher of the two voltages is disposed at the voltage of the row select line with the read circuitry comprising a bipolar transistor for connecting the row select line to the column read line when the voltage on the sensed one of the storage nodes is at the row select voltage level. The column read line is connected to a current sense amp for the sensing operation. The driving circuit for a Write operation is provided by a bipolar transistor connected between one of the storage nodes and the row select voltage on the row line to selectively pull the storage node up to the row select voltage level. The bipolar transistor is controlled by an ECL gate circuit connected through the column write line.

A technical advantage is provided by the present invention by combining the low current static operation of a CMOS latch with the high speed operation of ECL circuitry. The row line is driven by a low source impedance circuit between ECL compatible voltages with the Read operation provided by an ECL current sense amp which is driven by a low source impedance bipolar transistor. The low source impedance bipolar transistor is controlled by the votage on the storage node in the CMOS latch.

A further technical advantage is provided by writing to the CMOS latch with an ECL circuit having a low source impedance bipolar transistor connected between one of the storage nodes and a reference voltage. The driving transistor is controlled by an ECL circuit to provide high speed operation.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
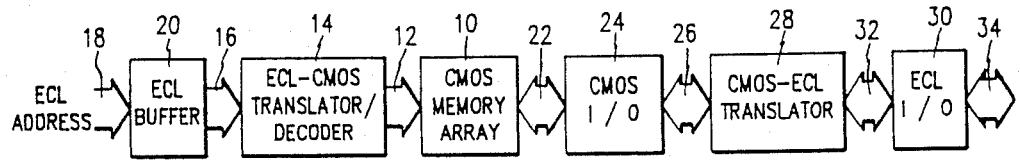
FIG. 1 illustrates a schematic block diagram of a prior art BICMOS memory array.

Referring now to FIG. 1, there is illustrated a schematic block diagram of a prior art high speed memory utilizing emitter coupled logic (ECL) technology for the input and output circuitry and CMOS technology for storage of data. The memory of FIG. 1 utilizes a CMOS memory array 10 that receives a CMOS compatible address from an address bus 12. The address is output by an ECL to CMOS translator 14. The translator 14 receives at the input thereof ECL compatible voltages from a bus 16 that are converted to CMOS compatible voltage swings on bus 12. The signals on bus 16 are received from an input address line 18 which is buffered by an ECL buffer 20.

The CMOS memory array 10 interfaces an Input-/Output (I/O) bus 22 with a CMOS I/O circuit 24. The CMOS I/O circuit 24 in turn interfaces through the bus 26 with a CMOS to ECL translator 28 which is operable to translate voltage levels from CMOS to ECL for data that is being read from the memory array 10 and also to translate signals from ECL to CMOS that are being written to the memory array 10. The translator 28 interfaces with an ECL I/O circuit 30 through a bus 32. The ECL I/O circuit 30 interfaces with the data input/output port of the device through bus 34.

The prior art system utilizing CMOS memory array 10 has significant disadvantages due to the speed of operation. First of all, the memory array 10 operates at the speed of a CMOS device with additional time delays incurred in the translators 14 and 28. The ECL circuitry by comparison operates at high speed and also provides the capability of interfacing with ECL compatible input/output signals, data, and row and column address signals. This is necessitated since conventional high speed memories are normally specified for use with bipolar compatible signals.

Figure 2:
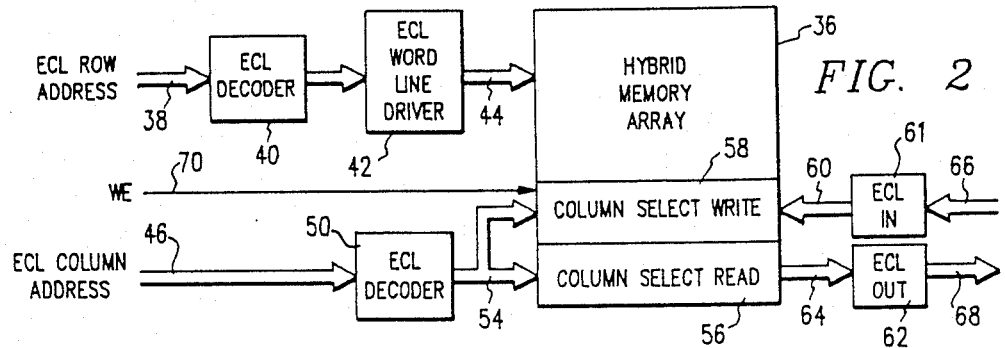
FIG. 2 illustrates a schematic block diagram of a memory utilizing the hybrid memory cell of the present invention.

Referring now to FIG. 2 there is illustrated a schematic block diagram of the memory of the present invention utilizing a hybrid memory cell in a hybrid memory array 36. The hybrid memory array 36 is operable to receive access signals or Word Line signals which are ECL compatible and to output ECL compatible output signals. The access time therefore approaches that of an ECL static memory. However, the memory cells of the array 36, as will be described hereinbelow, utilize CMOS latches which consume virtually no current in the static state. In addition, column select and write functions of the hybrid memory array are also ECL compatible such that no ECL to CMOS translation circuits are needed to access the memory array.

The memory array 36 is comprised of a plurality of rows and columns of memory cells with rows being selected by a row address which is received on an input row address bus 38. The row address is decoded in an ECL decoder 40 which drives a Word Line driver 42 for output of a single Word Line to each row of memory cells in the array 36 on Word Lines 44. Only one Word Line is selected for any given row address on row address bus 38 with the signal output being ECL compatible.

A column in the array 36 is selected by a column address bus 46 which receives ECL compatible address signals. The column address on bus 46 is input to an ECL decoder 50 on a bus 52 for output on column select lines 54. One column select line is activated for a given column address on bus 46. No voltage translation is required from ECL compatible voltages in order to select the column. The column select lines 54 are input to a column select read circuit 56 and a column select Write circuit 58. The column select Write circuit 58 is operable to receive input data on a bus 60 from an ECL input buffer 61 which is interfaced with an input data bus 66. The column Read circuit 56 is operable to transfer accessed data from the memory array 36 to an ECL output buffer circuit 62 on a bus 64 which circuit is interfaced to an output bus 68. The column select Write circuit 58 also requires a Write enable signal (WE), as will be described hereinbelow, which is received on line 69.

Figure 3:
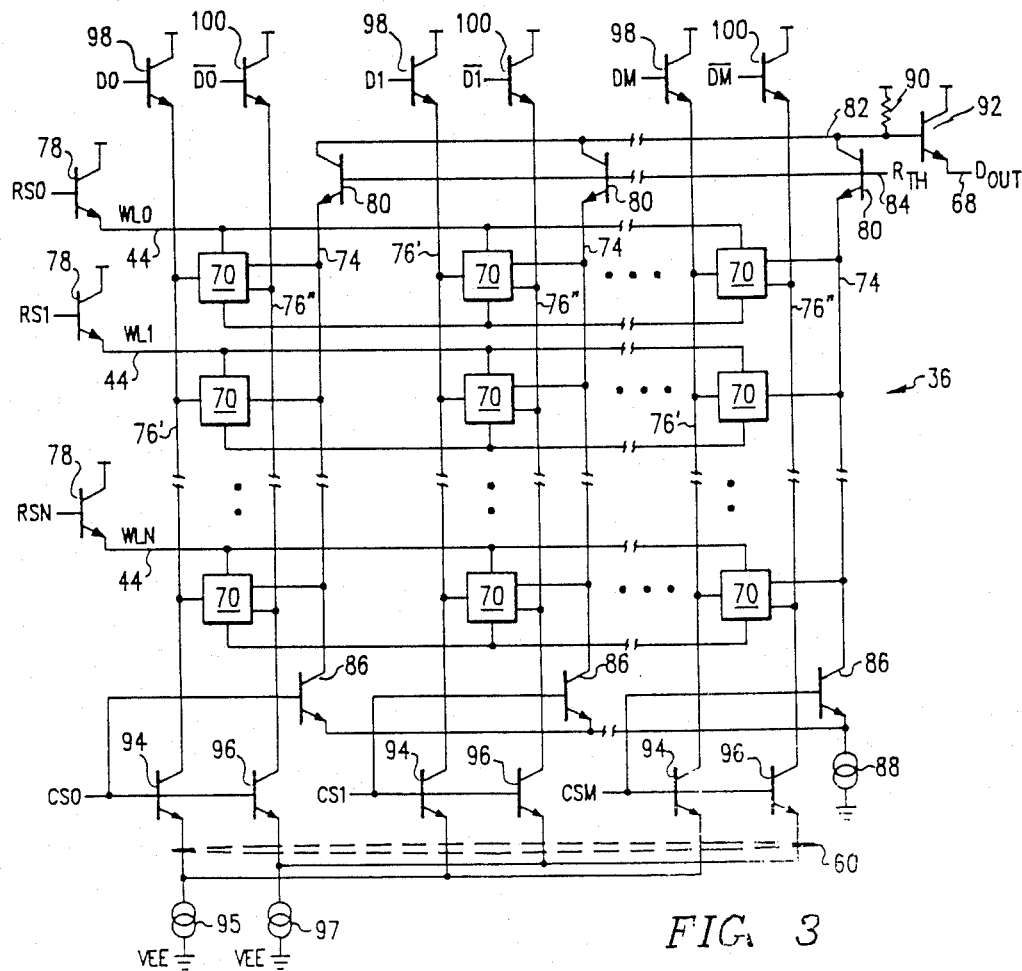
FIG. 3 illustrates a schematic diagram of the memory array.

Referring now to FIG. 3 there is illustrated a schematic diagram of the memory array 36, a portion of the column select Write circuit 58 and the column select Read circuit 56 of FIG. 2. The memory array 36 is comprised of memory elements 70 which are arranged in rows and columns. There are N rows and M columns with row select lines RS0-RSN and column select lines CS0-CSN. For simplicity purposes, only rows corresponding to row select lines RS0, RS1 and RSN are illustrated and columns corresponding to column select lines CS0, CS1 and CSM are illustrated.

Each of the memory elements 70 is associated with one row and one column. Memory cells 70 are each connected to one of the word lines 44 on a word select input, to a Read column line 74 for the associated column and to two Write data column lines 76' and 76". Each of the Word Lines 44 is connected to the emitter of a driver transistor 78, the collector of which is connected to the supply voltage $V_{CC}$ and the base of which is connected to one of the row select signals RS0-RSN. The column data output line for each column is connected to the emitter of a threshold transistor 80, the collector of which is connected to a node 82 and the base of which is connected to a threshold terminal 84, which threshold terminal 84 is connected to a threshold reference voltage $R_{TH}$. Each of the transistors 80 in the columns of array 36 have the base thereof connected to threshold terminal 84 and the collector thereof connected to node 82. Each of the column output lines 74 are also connected through an NPN transistor 86 to a current source 88 which is connected on one side to $V_{EE}$. Node 82 is connected through a resistor 90 to $V_{CC}$ and also to the base of an output drive transistor 92. The collector of drive transistor 92 is connected to $V_{CC}$ and the emitter thereof is connected to the output bus 68. Each of the NPN transistors 86 has the base thereof connected to an associated one of the column select lines CS0–CSM. Transistors 80, transistors 92 and transistors 86 operate to perform the column select function of circuit 56 in FIG. 2.

In operation, memory cells 70 are "Wired ORed" to the column output line 74. When the cells 70 on a particular column are not accessed, current is being conducted through only one of the NPN transistors 86 corresponding to the select column. For the selected column, current is either being conducted through the threshold transistor 80 to the current source 88 or being sourced from the selected memory cell 70. When current is conducted by transistor 80, the voltage of node 82 will be at the threshold voltage of $R_{TH}$ minus the emitter-base diode drop of threshold transistor 80. When current is sourced from one of the memory cells 70, node 82 will be at $V_{CC}$ rendering the threshold transistor 80 nonconductive. Therefore, for the selected column and row and the associated memory cell 70, the output data on the data output bus 68 will depend on whether current is being sourced to current source 88 from memory cell 70 or through threshold transistors 80.

The column select write circuit 58 is comprised of the column Write data lines 76' and 76" which are each connected through NPN transistors 94 and 96, respectively, to current sources 95 and 97, respectively. Current sources 95 and 97 are connected to $V_{EE}$. The bases of transistors 94 and 96 are each connected to the respective one of the column select lines CS0–CSM. The column select lines 76' and 76" are also connected to the emitters of NPN bipolar transistors 98 and 100, respectively, with the collectors of transistors 98 and 100 connected to $V_{CC}$ and the bases thereof connected to the noninverted and inverted forms of the data D0–DM. When a column is selected, both Write data lines 76' and 76" associated with the selected memory cell are connected to the respective current sources 95 and 97 through transistors 98 and 100, respectively. Selection of a memory cell 70 in addition to the presence of a Write Enable signal allows data on bus 62 to be input to the bases of transistors 98 and 100 such that only one of the transistors 98 or 100 can be turned on to supply current to current sources 95 or 97. When the base of either transistor 98 and 100 is high, current is supplied to the respective current source 95 or 97. However, when the base of either transistor 98 or 100 is low, current is supplied to the respective current source 95 or 97 by the selected memory cell. When a Write function is not being performed, the bases of all transistors 98 and 100 are held at $V_{CC}$. Therefore, a Write function requires only the presence of both the inverted and noninverted data on Write Data lines 76" and 76' and selection of the cell.

Figure 4:
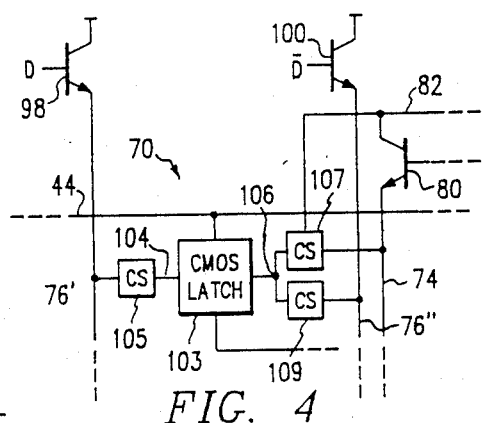
FIG. 4 illustrates a block diagram of the memory cell.

Referring now to FIG. 4, there is illustrated a block diagram of the memory cell 70 interfaced with the peripheral circuitry in the array. The memory cell 70 is comprised basically of a CMOS latch 103 which is operable to store two separate voltages on storage nodes 104 and 106. Storage nodes 104 and 106 are disposed at opposite voltages and represent a first logic state when the voltage at storage node 104 is low and the voltage at storage node 106 is high, and a second logic state when the voltage is reversed. The latch 103 has two voltage inputs, one of which is connected to $V_{EE}$ and the other of which is connected to the Word Line 44. As long as a predefined voltage level is maintained across the latch 103, the voltage on nodes 104 and 106 will remain "static." In order to change the logic state, one of the nodes must be forced to the opposite voltage level to "flip-flop" the latch. This in a conventionally operated latch.

The latch 103 has the output node 106 connected through a current switch 107 to the Write data line 76" and the node 104 is connected through a current switch 105 to the Write data line 76'. In a similar manner, the storage line 106 is connected through a current switch 109 to the sense amp at Read column line 74. Current switch 109 is enabled by Word Line 44 and is connected thereto.

In the static state, the CMOS latch 103 is maintained at a predetermined logic state by the presence of a holding voltage on the Word Line 44. When the cell 70 is selected, the Word Line 44 changes voltages in accordance with ECL compatible circuitry; that is, the voltage only varies a small amount, this voltage variation being an ECL compatible voltage swing. When the cell is selected, the logic state therein is read out by the current switch 109. The current switch 109 is operable to source current from the Word Line 44 to the Read column line 74 and subsequently to the current source 88, depending upon what the voltage on node 106 is. If the voltage on 106 is sufficiently high to trigger current switch 109, current is sourced from the Word Line 44 and not from node 82 through transistor 80. Transistor 80 and current switch 109 operate in conjunction to form the current sense amp of the ECL memory. When the cell is unselected, the voltage on node 106 will be lower, such that it will not enable current switch 109, thus preventing readout of the logic state stored in latch 103.

During a Read operation, as described above, it is only necessary to force one of the nodes 104 or 106 to a predetermined logic state. In the preferred embodiment, one of the nodes is forced to a high voltage and the other node allowed to remain low. If the node is already at a high voltage, it is not necessary to change the logic state. However, if the node is low and the logic state corresponding to the high voltage is to be written into the cell, it will be necessary to force the storage node 104 or 106 to a high voltage level. This is facilitated through the current switches 105 or 107 and the transistors 98 and 100.

When the cell is selected and a Write Enable signal is present, inverted and noninverted data is input to the base of transistors 100 and 198, respectively, and the voltage on the Word Line 44 is disposed at the selected voltage level. If the base of either of the transistors 98 or or 100 is low, this will turn the transistors off, and allow the current switch 105 or 107 to source current from the storage node 104 or 106, respectively, to the respective current sources 95 and 97. However, if the data on the bases of both transistors 98 and 100 is high, this will prevent nodes 104 or 106 being pulled high through the respective switch 105 or 107. However, a low voltage on either node 104 or 106 can only be pulled high if the Word Line voltage 44 is disposed at the cell select level. If not, the low voltage on the node 104 or 106 will remain. This Write function is facilitated by using devices 98 and 100 to interface with the ECL compatible data and also utilizing low source impedance devices for current sources 105 and 107 to allow rapid charging of nodes 104 and 106 on the CMOS latch 103. In a similar manner, current switch 109 provides a low source impedance from the Word Line 44 to the Read column line 74 such that the CMOS latch 103 does not have to drive a large capacitance bit line.

Figure 5:
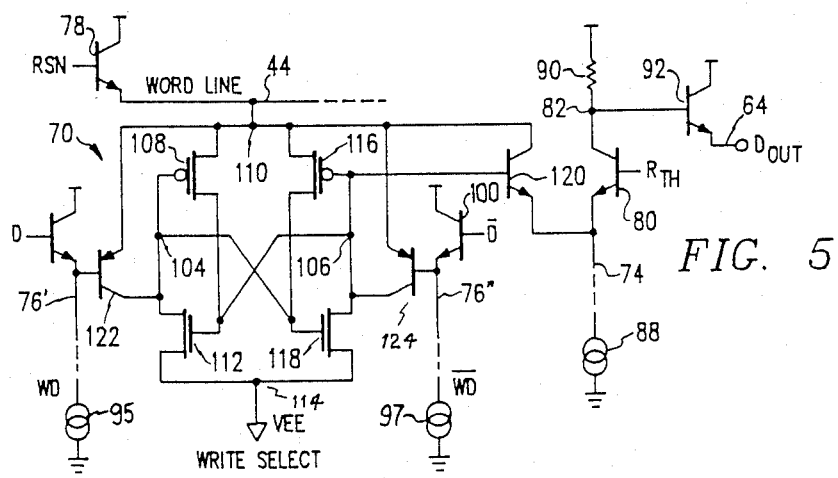
FIG. 5 illustrates a schematic diagram of the memory cell.

Referring now to FIG. 5, there is illustrated a detailed schematic diagram of the memory cell 70. The CMOS latch 103 has a cross coupled configuration between storage nodes 104 and 106. Storage node 104 is connected to the gate of a P-channel MOS transistor 108, the source of which is connected to a positive voltage node 110 and the drain of which is connected to storage node 106. Storage node 104 is also connected to the source of an N-channel transistor 112, the drain of which is connected to a low voltage node 114 and the gate of which is connected to storage node 106. In a similar manner, storage node 106 is connected to the gate of a P-channel transistor 116, the source of which is connected to high voltage node 110 and the drain of which is connected to storage node 104. Storage node 106 is also connected to the source of an N-channel transistor 118, the drain of which is connected to low voltage node 114 and the gate of which is connected to storage node 104. Storage node 106 comprises the output node and is connected to the gate of a bipolar NPN transistor 120, the collector of which is connected to high voltage node 110 and the emitter of which provides the output connection to column output line 74. Transistor 120 provides the function of current switch 109.

In operation, one of the storage nodes 104 and 106 will be at a high voltage level relative to the other to provide a "latched" state. Once the latched state is established, it is only necessary to maintain high voltage node 110 at a predetermined voltage higher than low voltage node 114. Typically, this will require a voltage difference that is greater than three threshold voltages ($V_T$) of the MOS transistors such that the gates of any of the transistors 108, 112, 116 and 118 have this voltage available to enable the respective device to turn on.

In order to read a voltage stored on node 106 from the cell, it is necessary for the voltage on node 106 to either be higher than the threshold voltage $R_{TH}$ on threshold transistor 80 or lower, depending upon the logic state. Therefore, current is either conducted through transistor 80 or transistor 120. When the cell 70 is nonselected, transistor 120 is maintained off by maintaining the voltage on node 106 below that of the threshold voltage $R_{TH}$ on threshold transistor 80. When the cell 70 is selected, transistor 120 is turned on for a high voltage on node 106 that is greater than $R_{TH}$. Transistor 120 sources current from Word Line 44 to current source 88. The voltage on either node 104 or node 106 will be equal to the voltage on high voltage node 110 in one logic state and the voltage on low voltage node 114 in the opposite logic state.

In the nonselected state, it is necessary that the maximum voltage on node 110 is always below the threshold of voltage $R_{TH}$. In the selected mode, the maximum voltage on node 110 is above the voltage on $R_{TH}$ such that a high voltage on node 106 will enable transistor 120 to conduct current to current source 88. In the preferred embodiment, node 110 in the nonselected state is disposed at a voltage of $V_{CC} - 2V_D$ where $V_D$ is the emitter-base forward biased diode voltage. In the selected state, the voltge is disposed at a voltage level of $V_{CC}$. Therefore, the threshold voltage $R_{TH}$ is disposed at a level between $V_{CC} - V_D$ and $V_{CC} - 2V_D$.

Selection of the memory cell 70 is controlled by the voltage on Word Line 44 which is driven in the selected state by transistor 78. This provides a Read function for accessing data stored in the memory cell with a low source impedance drive provided by transistor 120. Node 106 controls transistor 120 and is a capacitive node in the memory cell which is charged up by either transistor 108 or discharged by transistor 118. In a conventional MOS array, node 106 is required to drive a capacitive bit line. In order to perform this function, it would be necessary to utilize a rather large transistor 118 or transistor 108 to provide a relatively low series resistance to the capacitive bit line in addition to providing a sufficient voltage swing compatible with CMOS technology. By utilizing the bipolar transistor 120, small devices can be utilized for MOS transistors 108, 112, 116 and 118, since they only drive the base of transistor 120 with transistor 120 providing a very low source impedance to line 74. This allows the memory cell 70 to drive a higher capacitance load while utilizing smaller MOS transistors, thus resulting in a smaller overall cell. By utilizing MOS technology for the storage latch, low current operation is realized in the static state with the integrated bipolar transistor 120 in the memory cell 70 providing the low source impedance drive capabilities.

In order to change the logic state of the memory cell 70, a bipolar PNP transistor 122 is connected between nodes 110 and 104 with the emitter thereof connected to node 110 and the collector thereof connected to node 114. The base of transistor 122 is connected to the Write Data line 76'. In a similar manner, a bipolar PNP transistor 124 is connected between nodes 110 and 106 with the emitter thereof connected to node 110 and the collector thereof connected to node 106. The base of transistor 124 os connected to the Write Data line 76". Transistors 122 and 124 provide the current switch function of current switches 105 and 107, respectively.

In operation, transistors 122 and 124 are operable to selectively connect either node 104 or node 106 to node 110, which node is connected to Word Line 44. As described above, Word Line 44 in the select state is disposed at $V_{CC} - V_D$ and in the nonselect state at $V_{CC} - 2V_D$. In order for transistor 122 or transistor 124 to pull the respective node 104 or 106 up to the Word Line voltage, it is necessary that the voltage on the Write Data lines 76' and 76" are at least at a diode voltage $V_D$ below the Word Line voltage. Therefore, the voltage on the Write Data lines 76' and 76" is varied between $V_{CC} - V_D$ and $V_{CC} - 2V_D$. This, of course, requires that the data be varied between $V_{CC}$ and $V_{CC} - V_D$. When the Write Data lines 76' and 76" are disposed at $V_{CC} - V_D$, the transistors 122 and 124 will not be turned on regardless of whether the memory cell is selected or nonselected. However, when one of the Write Data lines 76' or 76" is disposed at $V_{CC} - 2V_D$, the corresponding PNP transistors 122 or 124 will conduct and pull the respective node 104 or 106 high, thus forcing the latch to a predetermined state. Since the PNP transistors 122 and 124 have a low source impedance, the capacitance associated with nodes 104 and 106 can be charged very quickly to raise the respective node to a higher voltage. This is to be compared with a CMOS circuit wherein the node must be pulled from a low voltage to a high voltage or from a high voltage to a low voltage through the source-to-drain path CMOS transistor which inherently has a higher series resistance due to the non-linear resistance characteristics of the MOS devices. Further, Write Data lines 76' and 76" and their associated capacitance in no way affect the speed at which the capacitance nodes 104 and 106 change voltages.

Figure 6:
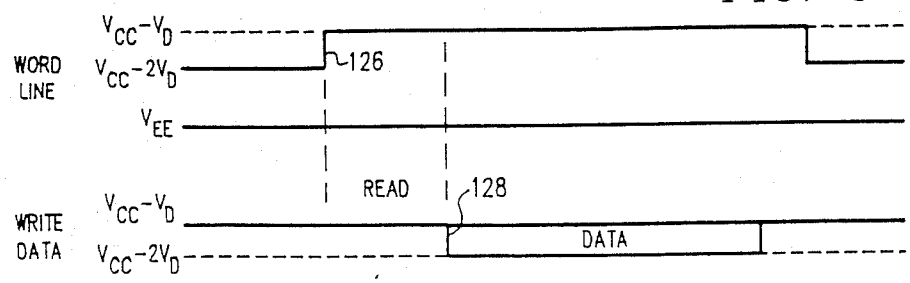
FIG. 6 illustrates a timing diagram for the read and write operation.

Referring now to FIG. 6, there are illustrated timing diagrams for the Word Line and Write Data signals illustrating the Read and Write operations. Initially, the Word Line is disposed at a voltage of $V_{CC} - 2V_D$. Since, as described above with respect to FIG. 5, the minimum voltge on the column Write Data lines 76' and 76" is $V_{CC} - 2V_D$, transistors 122 and 124 will not be turned on to alter the logic state on nodes 104 and 106. It is only necessary that the difference between the voltage $V_{CC} - 2V_D$ on high voltage node 110 and the voltage $V_{EE}$ on low voltage node 114 differ by approximately three $V_{TS}$ to maintain the stored logic states on nodes 104 and 106.

The cell 70 is selected by raising the voltage on Word Line 44 from a level of $V_{CC} - 2V_D$ to a level of $V_{CC} - V_D$. This is noted by an edge 126 on the Word Line signal. When the Word Line 44 is high, the memory cell 70 is operable to be read such that a high voltage level on node 106 results in transistor 122 conducting. If it is desired to write information into the cell, one of the noninverted or inverted data signals D is varied between $V_{CC}$ and $V_{CC} - V_D$ to change the voltage on Write Data lines 76' and 76" between $V_{CC} - V_D$ and $V_{CC} - 2V_D$ to turn on the respective one of the bipolar PNP transistors 122 or 124, thus charging the respective node 104 or 106. For example, if transistor 112 is turned on discharging node 104, this will turn on P-channel transistor 108 which connects the voltage on node 110 to node 106, thus turning off P-channel transistor 116. This latches a low voltage onto node 104 and a high voltage onto node 106. This operation is initiated at a clock edge 128 on the Write Data signal. The Write operation is therefore initiated when data is input to transistors 98 and 100 and the cell is selected. It is important to note that the collector of transistor 120 is connected to high voltage node 110. For the selected state and with a high voltage on node 106, node 110 is connected through P-channel transistor 108 to node 106. Therefore, any change in the voltage on node 106 in a high voltage state will be reflected on the collector of transistor 120. This prevents transistor 120 from turning off due to other clock signals in the system affecting levels on node 106 due to bootstrapping of voltages through to node 106.

Figure 7:
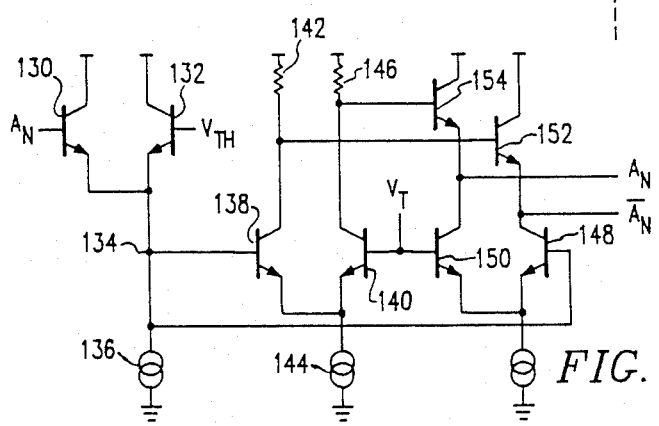
FIG. 7 illustrates a schematic diagram of an ECL buffer.

Referring now to FIG. 7, there is illustrated a schematic diagram of an input ECL buffer for receiving one of the address lines $A_N$ for the row or the column address. The address signal $A_N$ is input to one input of an ECL gate which is comprised of two NPN bipolar transistors 130 and 132 with the base of transistor 130 connected to the signal line $A_N$ and the base of transistor 132 connected to a threshold voltage $V_{TH}$. The collectors of transistors 130 and 132 are connected to $V_{CC}$ and the emitters thereof are connected to a node 134. Node 134 is connected to a current source 136 to provide current for the input gate.

Node 134 is input to second ECL gate which is comprised of two NPN transistors 138 and 140, the base of transistor 138 connected to node 134 and the base of transistor 140 connected to a threshold voltage $V_T$. The collector of transistor 138 is connected to $V_{CC}$ through a resistor 142 and the emitter thereof connected to a current source 144. Transistor 140 has the collector thereof connected to $V_{CC}$ through a resistor 146 and the emitter thereof connected to current source 144.

Node 134 is also connected to a third ECL gate which is comprised of two NPN transistors 148 and 150, the base of transistor 148 connected to node 134 and the base of transistor 150 connected to threshold voltage $V_T$. The collector of transistor 148 is connected through the emitter-collector path of an NPN transistor 152 to $V_{CC}$, and the collector of transistor 150 is connected through the emitter-collector path of an NPN transistor 154 to $V_{CC}$. Transistor 152 has the base thereof connected to the collector of transistor 138 and the transistor 154 has the base thereof connected to the collector of transistor 140. The collector of transistor 150 comprises the noninverted address signal $A_N$ and the collector transistor 148 comprises the inverted form of the address signal $A_N$.

The voltage level of the noninverted data and the inverted form thereof varies between $V_{CC} - V_D$ and $V_{CC} - 2V_D$. In the high voltage state, transistor 148 is turned on, thus turning off transistor 150 and transistor 140, such that the voltage on the emitter of the transistor 154 is disposed at $V_{CC} - V_D$. In the opposite logic state, transistor 148 and transistor 138 are turned off and transistors 140 and 150 are turned on resulting in current being drawn through resistor 146 and transistor 140 to current source 144. The value if resistor 146 is adjusted such that the voltage drop thereacross is approximately equal to one diode drop, resulting in the voltage on the emitter of transistor 154 being disposed at a voltage $V_{CC} - 2V_D$.

Figure 8:
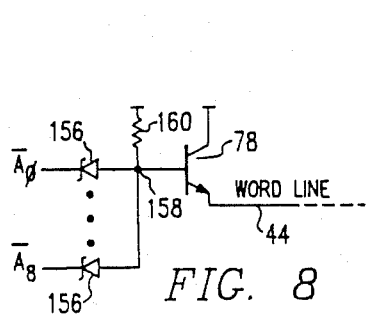
FIG. 8 illustrates a schematic diagram of an ECL decoder.

Referring now to FIG. 8, there is illustrated a schematic diagram of an ECL decoder. The ECL decoder is connected to the output of the buffer in FIG. 6 and is comprised of a series of diodes 156 which each have the anode thereof connected to a node 158 and the cathode thereof connected one of the respective outputs of the buffer of FIG. 6. When each of the address signals $A_0$-$A_N$ or the inverted forms thereof are high (i.e. $V_{CC} - V_D$), node 158 will be high. However, if any of the address signals are low (i.e. $V_{CC} - 2V_D$), node 158 will be pulled down to a voltage of $V_{CC} - V_D$. Node 158 is connected to $V_{CC}$ through a resistor 160 and also to the base of the Word Line driver transistor 78. When node 158 is high or at $V_{CC}$, transistor 78 will conduct and raise the Word Line 44 to a voltage of $V_{CC} - V_D$. When node 158 is low or at $V_{CC} - V_D$, the Word Line 44 will be at a voltage of $V_{CC} - 2V_D$.

Figure 9:
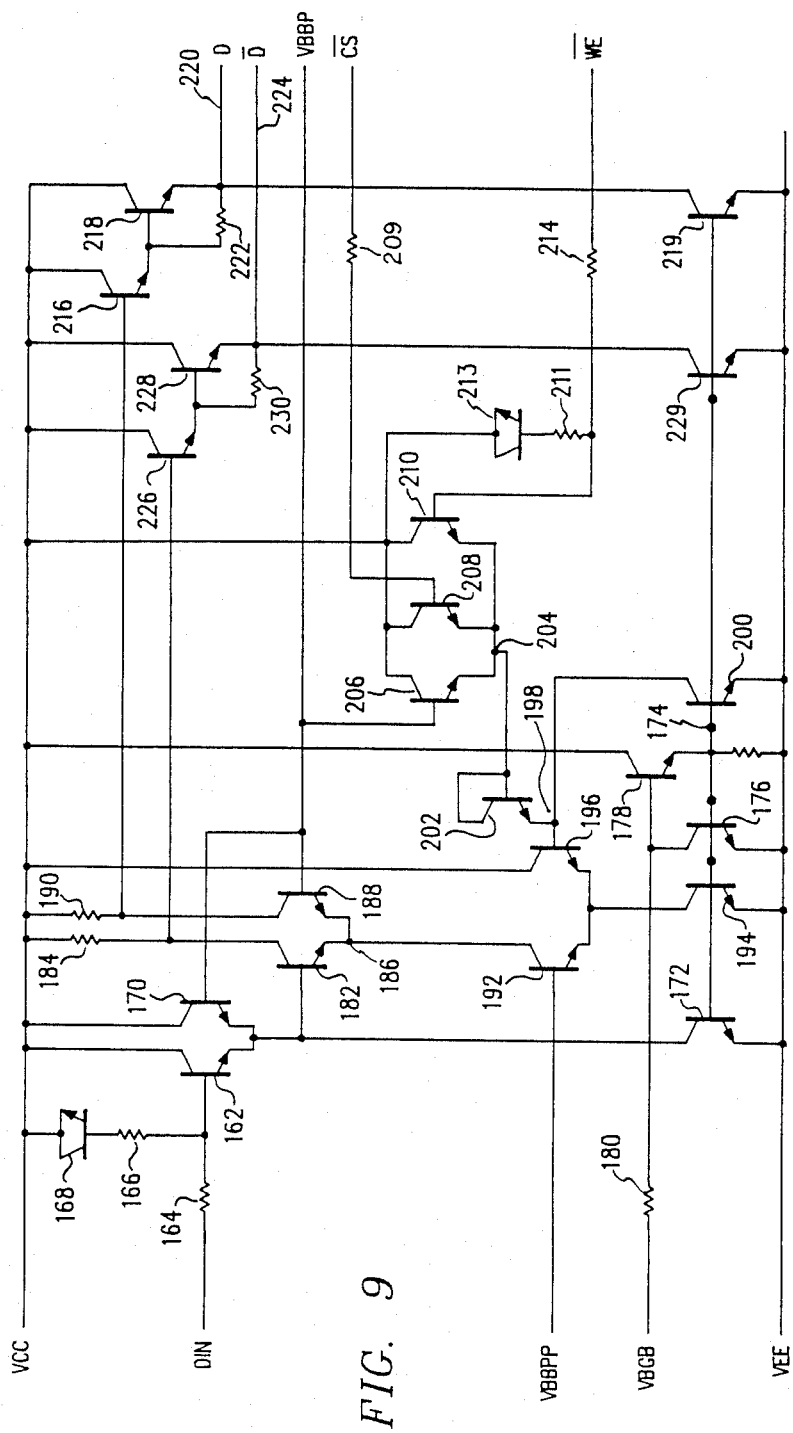
FIG. 9 illustrates a schematic diagram of the data input buffer.

Referring now to FIG. 9, there is illustrated a schematic diagram of the Write Enable circuit for providing noninverted and inverted forms of the data. The providing noninverted and inverted forms of the data. The data is input to the base of an NPN transistor 162 through a series resistor 164. The base of transistor 162 is also connected to $V_{CC}$ through a series resistor 166 and diode configured transistor 168. Transistor 168 has the emitter and collector tied together to $V_{CC}$ to provide the diode configuration. Transistor 162 forms one side of a differential ECL amplifier with the other side formed by an NPN transistor 170, the base of which is connected to a reference voltage VBBP, the collector of which is connected to $V_{CC}$ and the emitter of which is connected to the emitter of transistor 162. Transistor 162 also has the collector thereof connected to $V_{CC}$. The emitter of transistors 162 and 170 are connected to the collector of an NPN transistor 172, the emitter of which is connected to $V_{EE}$ with transistor 172 functioning as a current source. The base of transistor 172 is connected to a node 174. Node 174 is connected to the base of transistor 176, the emitter of which is connected to $V_{EE}$, and the collector of which is connected to the base of a transistor 178. Transistor 178 has the emitter thereof connected to node 174 and the collector thereof connected to $V_{CC}$. The base of transistor 178 is also connected through a resistor 180 to a reference voltage VBGB which is offset from $V_{EE}$. Transistors 176 and 178 provide a current reference to the base of transistor 172, thus forming a current source.

The output of the differential amplifiers formed by transistors 162 and 170 is generated at the junction of the emitters thereof and is input to a second differential amplifier to the base of an NPN transistor 182. The collector of transistor 182 is connected to $V_{CC}$ through a resistor 184 and the emitter thereof connected to a node 186. Transistor 182 forms one side of the differential amplifier with the other side being formed by an NPN transistor 188 which has the base thereof connected to the reference voltage VBBP, the collector thereof connected to $V_{CC}$ through a resistor 190 and the emitter thereof connected to node 186. Thd node 186 is connected to the collector of an NPN transistor 192, the base of which is connected to a reference voltage VBBPP and the emitter of which is connected to the collector of a current source transistor 194, transistor 194 having the base thereof connected to node 174 and the emitter thereof connected to $V_{EE}$. Transistor 192 forms one side of a differential amplifier with the other side formed by NPN transistor 196, the base of which is connected to a node 198 and the collector of which is connected to $V_{CC}$. Node 198 is connected to a current source transistor 200, the base of which is connected to node 174 and the emitter of which is connected to $V_{EE}$. Additionally, node 198 is connected to the emitter of a transistor 202, the base and collector of which are connected to a node 204. Node 204 is connected to the emitters of NPN transistors 206, 208 and 210 which have respective collectors connected to $V_{CC}$. Base of transistor 210 is connected to $V_{CC}$ through a series resistors 211 and diode configured transistor 213. Transistor 206 has the base thereof connected to voltage VBBB. The base of transistor 28 is connected to an inverted chip select signal (CS) through a resistor 212. Transistor 210 has the collector connected thereof to $V_{CC}$ and the base thereof connected to the inverted form of the Write Enable Signal WE through a resistor 214.

The gate formed by transistors 182 and 188 provides the output data. The noninverted form of the data D is output form the collector of transistor 188 to the base of an NPN transistor 216, the collector of which is connected to $V_{CC}$ and the emitter of which is connected to the base of an NPN transistor 218. Transistors 218 has the collector thereof connected to $V_{CC}$ and the emitter thereof connected to an output pad 220, which comprises the noninverted form of data D. The emitter of transistor 218 is also connected to a current source transistor 219 configured similar to transistor 200. A resistor 222 is connected between the base of transistor 218 and pad 220. In a similar manner, the inverted form of the data D is provided on the collector of the transistor 182 and is connected through an output circuit to output line 224, output line 224 providing the inverted form of the data D. The output circuit is comprised of two transistors 226 and 228 which are similar in function to transistors 216 and 218, respectively, with a current source transistor 229 configured similar to transistor 219. A resistor 230 is provided which functions similar to resistor 222.

In operation, a high data input level turns on transistor 162 which conducts to provide current to current source transistor 172 which also turns on transistor 182 and, if transistor 192 is conducting, conducts current to current source transistor 194. This lowers the voltage on the collector of transistor 182 by the voltage drop across resistor 184. Transistors 226 and 228 are two series connected emitter followers which result in the voltage on the output line 224 being $2V_D$ below the voltage on the collector of transistor 182 which, as described above, is equal to the voltage drop across resistor 184. With the same high logic state for the input signal DIN, the transistor 188 in the second gate will be turned off, pulling the base of transistors 216 to $V_{CC}$, resulting in a drop of $2V_D$ across transistor 216 and 218 on the output terminal 220 for the noninverted form of the output data D.

In the opposite low logis state, the voltage on DIN is lowered below the reference voltage VBBP such that it turns off transistor 162 and turns on transistor 170. This results in the voltage in the base of transistor being VBBP - $V_D$ which turns off transistor 182 and turns on transistor 188. This results in transistor 188 conducting, assuming transistor 192 conducts, and creates a voltage drop across resistor 190. An additional voltage drop of up to $V_D$ is provided across transistors 216 and 218 on output terminal 220, resulting in a voltage of $V_{CC}$ - $2V_D$ minus the voltage drop across resistor 190 which is approximately. The voltage on output terminal 224 is $V_{CC}$ - $2V_D$. Therefore, its voltage varys between approximately $V_{CC}$ - $2V_D$ to $V_{CC}$ - $3V_D$. For simplicity purposes, the description of the Write operation described hereinabove utilizes a voltage variations of $V_{CC}$ - $V_D$ to $V_{CC}$ - $2V_D$.

If transistor 192 is nonconducting, the collector of both transistors 182 and 180 will be at $V_{CC}$ such that the voltage on both terminals 220 and 224 will be $V_{CC}$ - $2V_D$. This represents the high logic state on both terminals. In order to turn transistor 192 on, transistor 196 must be turned off by sourcing current form node 198 through current source transistor 200 to $V_{EE}$. This is controlled by the inverted form of the Write Enable signal; that is, the circuit will be enabled to write data when the Write Enable signal is in the low logic state and will be inhibited from writing when the Write Enable signal is in the high logic state. Therefore, for a Write operation, the inverted form of the Write Enable signal will be low and for a nonwrite operation, the inverted form of the Write Enable signal will be high. In the nonwrite operation, transistor 210 is turned on which raises the base of transistor 198 above the VBBPP, which is the reference voltage on the base of transistor 192. In a similar manner, if the inverted form of the chip select signal is high, transistor 208 will be turned on, which also turns on transistor 196.

For the Write operation, the inverted form of the Write Enable signal is low, turning off transistor 210 to allow transistor 206 to turn on. The voltage on node 198 will then be the VBBP - $2V_D$ which is less than VBBPP, such that transistor 192 will then conduct and transistor 196 will be turned off.

In summary, there has been provided a hybrid memory which utilizes bipolar circuitry for selecting a given cell, accessing the cell for a Read operation and also writing data to the cell. This cell is comprised of an MOS latch which in a static state requires very little current to maintain a latched state. Both the column lines and the row lines have low source impedances drivers associated therewith to allow selection of an entire row of cells and for writing information thereto.

Although the preferred embodiment has been described in detail, it should be u nderstood that various changes, substitutions and alterations can be made therein without departing from the spirit and scope of the invention as defined by the appended claims.

What is claimed is:

1. An ECL high speed semiconductor memory, comprising:
   an array of memory cells arranged in rows and columns, each of said memory cells comprising a CMOS cross-coupled latch having first and second storage nodes, each of said storage nodes operable to store either a first or a second voltage level representative of first and second logic states and disposed at opposite ones of said first and second voltage levels;
   a plurality of row lines each associated with a row of said memory cells;
   a plurality of column read lines each associated with a column of said memory cells;
   a plurality of column write lines each associated with a column of said memory cells;
   ECL address circuitry for receiving and decoding row and column address and in generating a row select signal for a signal row and a column select signal for a select column;
   row select circuitry for generating a row select voltage at a first predetermined voltage on said row line for the select one of the rows of said memory cells in response to generation of said row select signal, the remainder of said row lines associated with nonselected cells disposed at a second predetermined voltage, said first and second predetermined voltages being at ECL compatible voltage levels different from the first and second voltage levels of said CMOS latch;
   read circuitry associated with each cell for sensing the voltage stored on one of said first and second nodes in the associated cell in response to said associated row line being at said row select voltage and sourcing current from said row line to the associated one of said column read lines when the voltage on said sense of storage node is at a predetermined one of such first or second voltage levels;
   a current sense amp interfaced with each of said column read lines to sense current sourced from a selected of one of said row lines to said column read lines when said column line is selected in response to generation of said column select signal for the associated cell, said sense amp providing a data output;
   ECL data circuitry for receiving external data and switching current through said column write line for the selected column of cells in response to generation of the column select signal and also in response to receiving an external Write Enable signal; and
   current sense circuitry associated with each cell for sensing the current level in the column line associated with each of said memory cells for forcing said first and second storage nodes to a predetermined one of said first and second voltage levels corresponding to the logic state of the received data.

2. The semiconductor memory of claim 1 wherein said ECL address circuitry comprises:
   an ECL row address decoder having a plurality of outputs, each output associated with one of said row lines, said row decoder operable to receive said row address for decoding thereof to generate said row select signal on the one of said outputs corresponding to the received address for input to said row select circuitry;
   an ECL column decoder having a plurality of outputs, each output associated with one of the columns of said memory cells and operable to receive and decode said column address for activation of one of said outputs to provide said column select signal corresponding to the received column address.

3. The semiconductor memory of claim 2 wherein said row select circuitry comprises a row line driver associated with each row for varying the voltage on the row line from said second predetermined voltage to said row select voltage at said first predetermined voltage in response to generation to said corresponding row select signal on the activated one of the outputs of said row address decoder.

4. The semiconductor memory of claim 1 wherein said read circuitry comprises a current switch associated with each cell and connected between the said associated row line and said associated column read line for sourcing current from said associated row line to said associated column read line when said associated cell is selected and the sensed one of said first and second nodes is at a predetermined one of said first and second voltage levels to represent one of said first and second logic states and for inhibiting current from said associated row line to said associated column read line when said associated cell is not selected.

5. The semiconductor memory of claim 1 wherein the higher of said first or second voltage levels in said CMOS latch is disposed at the voltage level of said associated row line and said read circuitry comprises a bipolar transistor having an emitter-collector path connected between said associated row line and associated column read line and a base connected to the sensed one of said first and second nodes in the associated cell such that said bipolar transistor sources current to said associated column read line when said associated column read line is selected and said row line is disposed at said row select voltage.

6. The semiconductor memory of claim 1 wherein the higher of said first or second voltage levels in said CMOS latch is disposed at the voltage level of said associated row line and said data circuitry comprises:
   write enable circuitry for receiving said external data and said Write Enable signal and outputting logic signals corresponding to the logic state of said data when said Write Enable signal is present; and
   a switched current source for switching current through an associated one of said column write lines in response to data output from said Write Enable circuit.

7. The semiconductor memory of claim 6 wherein:
   said column write lines comprise an inverted column write line and a noninverted column write line; and
   said ECL gate comprises a switched current source having first and second outputs respectively connected to each of said noninverted and inverted column write lines;

said Write Enable circuit outputting a noninverted and an inverted form of said data on said first and second outputs, respectively, in the presence of said Write Enable signal and, when said Write Enable signal is not present, said Write Enable circuit outputs a predetermined voltage level;

said current sense circuitry operable to change the logic state in said storage cell only when inverted and noninverted data are output from said Write Enable circuitry.

8. The semiconductor memory of claim 7 wherein said current sense circuitry comprises first and second switches connected between said first and second storage nodes and a reference voltage and each connected to one of said inverted and noninverted column write lines to sense the current therein to selectively force the voltage of one of the associated first and second nodes to the predetermined reference.

9. The semiconductor memory of claim 7 wherein the predetermined reference is the voltage of said selected row line.

10. The memory of claim 7 wherein said switch comprises a PNP transistor connected between the associated one of said first and second nodes and said selected row line and the base thereof connected to the associated one of said column write lines.

11. A method for accessing stored information in a semiconductor memory, comprising:

providing an array of memory cells arranged in rows and columns, each of the memory cells comprising an MOS latch for storing first and second voltage levels as first and second logic states, respectively;

receiving and decoding row and column addresses and generating a row select signal for a select row and a column select signal for a select column;

generating a row select voltage at a first predetermined voltage and applying it to the row line associated with the select one of the cells in response to generation of the row select signal, the remainder of the row lines associated with nonselected cells disposed at a second predetermined voltage;

said first and second predetermined voltages being at voltage levels different from the voltage levels of the MOS latch and compatible with emitter coupled logic voltage levels;

sensing the stored voltage of the associated cell in response to the associated row line being at the row select voltage, and driving the associated one of the column lines with a bipolar low source impedance to output a signal to the associated column line representative of the stored logic state;

sensing the representative logic state in response to generation of the column select signal for the associated cell;

receiving external data and interfacing the received data to the column line of the selected column of cells in response to generation of the column select signal and in response to receiving an external Write Enable signal; and forcing the logic state in the one of the cells associated with the selected row and column to a voltage corresponding to the logic state of the receiving data on the selected column.

* * * * *